United States Patent [19]

Murayama et al.

[11] Patent Number: 5,282,234
[45] Date of Patent: Jan. 25, 1994

[54] BI-DIRECTIONAL SHIFT REGISTER USEFUL AS SCANNING REGISTERS FOR ACTIVE MATRIX DISPLAYS AND SOLID STATE IMAGE PICK-UP DEVICES

[75] Inventors: Jin Murayama; Makoto Shizukuishi, both of Kanagawa, Japan

[73] Assignee: Fuji Photo Film co., Ltd., Kanagawa, Japan

[21] Appl. No.: 76,936

[22] Filed: Jun. 16, 1993

Related U.S. Application Data

[63] Continuation of Ser. No. 700,986, May 16, 1991, abandoned.

[30] Foreign Application Priority Data

May 18, 1990 [JP] Japan ................ 2-2126781

[51] Int. Cl.$^5$ .............. G11C 19/00; G09G 3/36; H04N 3/14
[52] U.S. Cl. ................. 377/69; 377/70; 377/75; 377/78; 359/85; 345/50; 345/87; 348/294
[58] Field of Search ............ 377/54, 64, 69, 70, 377/75-80, 105, 106, 111, 115-117; 358/213.29; 340/784, 792, 800, 802, 814, 825.68, 789, 805, 811; 364/715.08; 359/55, 85

[56] References Cited

U.S. PATENT DOCUMENTS

| | | | |
|---|---|---|---|
| 4,433,372 | 2/1984 | Eichrodt et al. | 377/116 |
| 4,499,459 | 2/1985 | Sasaki et al. | 340/784 |
| 4,624,006 | 11/1986 | Rempfer et al. | 377/69 |
| 4,644,404 | 2/1987 | Tabei | 358/213.29 |
| 4,648,105 | 3/1987 | Priebe et al. | 377/64 |
| 4,665,538 | 3/1987 | Machida | 377/69 |
| 4,789,899 | 12/1988 | Takahashi et al. | 358/236 |
| 4,791,415 | 12/1988 | Takahashi | 340/784 |
| 4,795,239 | 1/1989 | Yamashita et al. | 359/57 |
| 5,008,905 | 4/1991 | Leo et al. | 377/69 |
| 5,191,450 | 3/1993 | Yajima et al. | 340/784 |

FOREIGN PATENT DOCUMENTS 0867997 5/1961 United Kingdom .............. 377/69

OTHER PUBLICATIONS

Fink et al, "Electronics Engineers' Handbook" McGraw—Hill—Second Edition—1982—pp. 16-15-1-6-19.

*Primary Examiner*—William L. Sikes
*Assistant Examiner*—Tai Van Duong
*Attorney, Agent, or Firm*—Sughrue, Mion, Zinn, Macpeak & Seas

[57] ABSTRACT

A bi-directional shift register capable of transferring bit data in either a forward or reverse direction. The shift register includes multiple transfer elements (e.g., flip-flop circuits) cascaded together which provide synchronous transfer of the bit data from one stage to an adjacent stage in either direction. The shift register further includes two switching circuits for electrically connecting an input terminal of one transfer element to an output terminal of the adjacent transfer element. The first switching circuit is enabled to cause the transfer of the bit data in the forward direction, and the second switching circuit is enabled to cause the transfer of the bit data in the reverse direction.

7 Claims, 5 Drawing Sheets

BI-DIRECTIONAL SHIFT REGISTER USEFUL AS SCANNING REGISTERS FOR ACTIVE MATRIX DISPLAYS AND SOLID STATE IMAGE PICK-UP DEVICES

This is a continuation of application Ser. No. 07/700,986 filed May 16, 1991, now abandoned.

BACKGROUND OF THE INVENTION

The present invention relates to a bi-directional shift register capable of easily changing the direction of data transfer, which can be used in solid-state image pickup and liquid crystal display devices.

A shift register has a wide range of application. For instance, a shift register may be used in a solid-state image pickup device. In such a device, the shift register can be employed as a horizontal scanning shift register and a vertical scanning shift register to read picture element signals in a scanning mode that are produced by photo-electric conversion elements. The shift register may also be used in a liquid crystal display unit. Here, the shift register is employed as a scanning register for applying a predetermined voltage to liquid crystal display elements corresponding to picture elements.

In the field of image processing, graphic design has become quite popular. For example, when picture element signals are produced by a solid-state image pickup device and displayed on a television monitor, the arrangement of the picture elements can be changed from the original optical image of the object or the arrangement of the picture element signals for the formation of an image can be changed, so that a different image is displayed on a liquid crystal display unit.

In a conventional shift register, the transfer speed can be adjusted by changing the frequency of the data transferring clock signal, or the data length can be adjusted by changing the number of transfer elements. However, the conventional shift register does not have the capability of changing the direction of transfer. Therefore, the shift register in the solid-state image pickup device or in the liquid crystal display unit serves merely as input/output drive means. That is, in the aforementioned field of image processing and graphic design, the solid-state image pickup device or the liquid crystal display unit operates merely as means for outputting or inputting picture element signals. Additional means are then necessary, such as a signal processing circuit or a computer program, to perform all the remaining data processing operations.

Accordingly, a great burden is placed upon the computer program or the signal processing circuit. In addition, the additional means may result in an increase in size and/or in manufacturing cost of the video equipment. Hence, the provision of the additional means may not be feasible. Therefore, the video equipment without the additional means cannot provide many graphic designs.

There has, however, been a strong demand in the art to process and produce images of all kinds of graphical designs.

A shift register that can transfer data not only in the forward direction but also in the reverse direction can meet such a demand. Moreover, such a shift register will have a variety of applications.

SUMMARY OF THE INVENTION

It is therefore an object of the present invention to provide a bi-directional shift register that can selectively transfer data in the forward direction or in the reverse direction and is free of the above-mentioned problems and disadvantages.

Figure 10A:
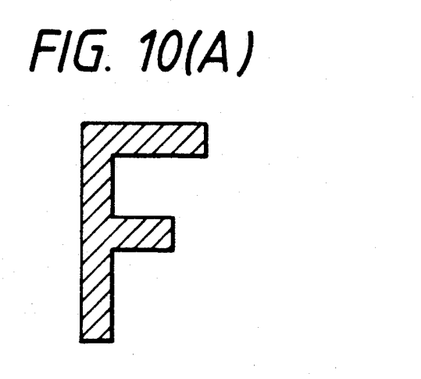
FIGS. 10(A) and (B) are explanatory diagram showing a mirror image.
Figure 10B:
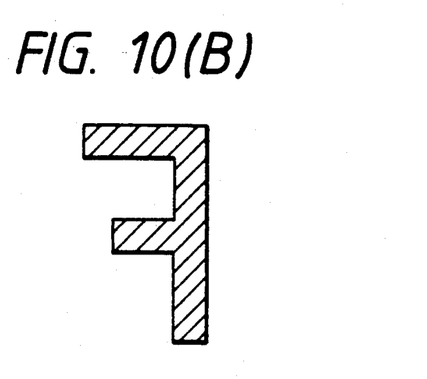

Another object of the present invention is to provide a solid-state image pickup device in which the order of reading picture element signals produced by picture elements is selectively changed, so that the normal image of an object, as shown in FIG. 10A, or the image of the object which is opposite to the normal image, as shown in FIG. 10B, i.e., the image of the object which is observed through a mirror (herein referred to as "a mirror image"), is produced.

A further object of the present invention is to provide a liquid crystal display unit in which the order of reading data by scanning is changed, so that the normal image of an object or the mirror image of the object is selectively produced.

In order to achieve the above and other objects, the technical concept of the invention is applied to a shift register having a plurality of cascade-connected transfer elements in which bit data is transmitted between front and rear transfer elements that are located adjacent to each other in synchronization with a clock signal so as to be transferred in a predetermined direction.

That is, in accordance with the present invention, between the output terminal of the front transfer element and the input terminal of the rear transfer element of the shift register, there are provided a first switching circuit which, in response to a first switching control instruction, electrically connects the output terminal of the front transfer element to the input terminal of the rear transfer element. Thus, bit data can be transferred from the front transfer element to the rear transfer element. A second switching circuit which, in response to a second switching control instruction, electrically connects the output terminal of the rear transfer element to the input terminal of the front transfer element, to transfer bit data from the rear transfer element to the front transfer element.

Furthermore, in accordance with the present invention, the above-described shift register is used as at least one horizontal shift register and one vertical shift register in a solid-state image pickup device. The solid-state image pickup device includes a plurality of photo-electric conversion elements corresponding to picture elements arranged in a matrix form, a horizontal shift register for scanning the photo-electric conversion elements horizontally, and a vertical shift register for scanning the photo-electric conversion elements vertically. According to the invention, at least one of the horizontal shift registers and the vertical shift registers is a shift register as described above.

In addition, the above-described shift register is used as a scanning register in a liquid crystal display unit that includes a plurality of liquid crystal display elements corresponding to picture elements arranged in a matrix form, and a scanning register for scanning the liquid crystal display elements for controlling the optical transmission of the liquid crystal display elements to display data.

In accordance with the present invention, the first switching circuits and the second switching circuits of the shift register are operated selectively, so that the data can be transferred not only in the forward direction but also the reverse direction.

In the solid-state image pickup device in which the shift register of the invention is employed as at least one of the horizontal scanning register and vertical scanning register, the order of reading data by scanning can be selectively changed, so that picture element signals can be outputted to reproduce not only normal images but also mirror images of an object. Hence, according to the invention, a solid-state image pickup device can form a mirror image of an object and thus meet the demands of image processing as it relates to graphic design.

Similarly, in the liquid crystal display unit where the shift register of the invention is employed as the scanning register, the order of reading data by scanning can be selectively changed, so that normal images or mirror images of the object can be displayed. Hence, a liquid crystal display unit which can display a mirror image of an object can be used to meet the demands of image processing as it relates to graphic design.

The above and other objects, features and advantages of the present invention will become more apparent from the following detailed description taken in conjunction with the accompanying drawings.

DESCRIPTION OF THE PREFERRED EMBODIMENTS

An example of a shift register in accordance with the present invention will now be described with reference to the accompanying drawings.

Figure 1:
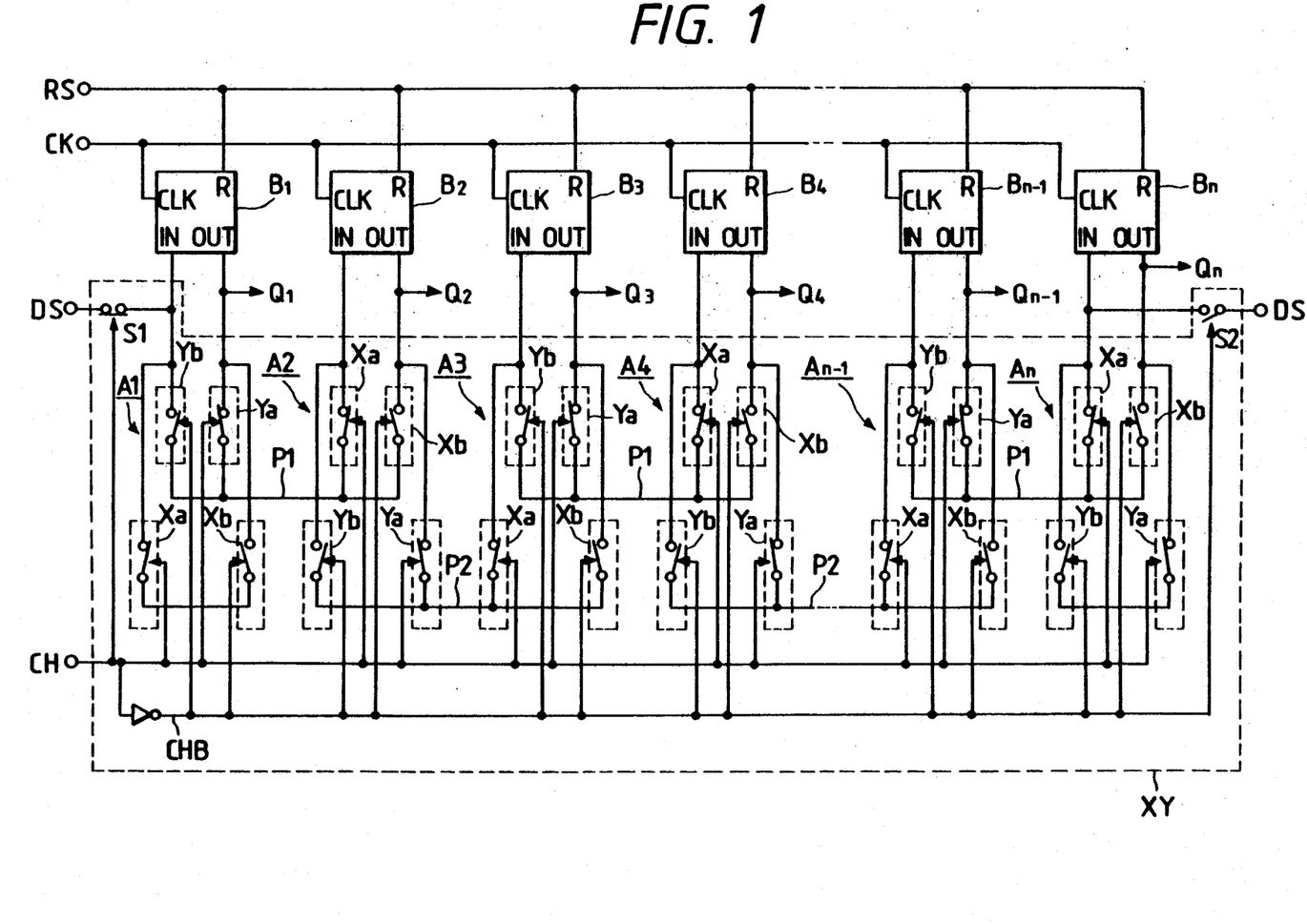
FIG. 1 is a circuit diagram showing an arrangement of one embodiment of a shift register according to the present invention.

Referring to FIG. 1, an arrangement of the shift register will be described. In FIG. 1, reference characters $B_1$ through $B_n$ designate transfer elements each of which holds one bit of data. The transfer element $B_1$ is positioned at the first stage, and the transfer element $B_n$ is positioned at the last stage, that is, all of the transfer elements are cascade-connected to one another.

A common reset signal RS is applied to the reset terminals R of the transfer elements $B_1$ through $B_n$, and a command clock signal CK is applied to the clock input terminals CLK.

The shift register further includes a control circuit XY for suitably switching an operation of transferring bit data from the transfer element in one stage to the transfer element in the following stage (herein referred to as "as a forward transfer") and an operation of transferring bit data in one stage to the transfer element in the preceding stage (herein referred to as "a reverse transfer").

The control circuit XY includes switching circuits $A_1$ through $A_n$, each of which are respectively provided to correspond to one of the transfer elements $B_1$ through $B_n$.

Each of the switching circuits $A_1$, $A_3$, $A_5$, ... which respectively correspond to odd-numbered transfer elements $B_1$, $B_3$, $B_5$, ... include a first network having switching elements Yb and Ya connected in series between the input terminal IN and the output terminal OUT of the respective transfer element. A second network has switching elements Xa and Xb connected in series between the same terminals IN and OUT.

As shown in the following truth table (TABLE 1), the switching elements Ya and Xa are rendered conductive (i.e., on) when a switching control signal CH is at the high ("H") level, and are rendered non-conductive (i.e., off) when the switching control signal CH is at the low ("L") level. On the other hand, the switching elements Yb and Xb are rendered non-conductive (i.e., off) when the switching control signal CH is at the high level, and are rendered conductive (i.e., on) when the switching control signal CH is at the low level. The switching elements Yb and Xb are controlled by the signal CHB which is obtained by inverting the switching control signal CH. The switching elements Ya, Xa, Yb and Xb, are operated simultaneously in synchronization with the switching signal CH.

TABLE 1

| CH | Truth Table | |
|----|-----|-----|
|    | "H" | "L" |
| Ya | on  | off |
| Yb | off | on  |
| Xa | on  | off |
| Xb | off | on  |

On the other hand, each of the switching circuits $A_2$, $A_4$, $A_6$, ... which respectively correspond to the even-numbered transfer elements $B_2$, $B_4$, $B_6$, ... include a first network having switching elements Xa and Xb connected in series between the input terminal IN and the output terminal OUT of the respective transfer element. A second network consisting of switching elements Yb and Ya is connected in series between the same terminals IN and OUT.

As shown in the above truth table, the switching elements Ya and Xa are rendered conductive (i.e., on) when the switching control signal CH is at the high level, and are rendered non-conductive (i.e., off) when the switching control signal CH is at the low level. On the other hand, the switching elements Yb and Xb are rendered non-conductive (i.e., off) when the switching control signal CH is at the high level, and are rendered conductive (i.e., on) when the switching control signal CH is at the low level. The switching elements Yb and Xb are controlled by the inverted signal CHB. The switching elements Ya, Xa, Yb and Xb are operated simultaneously in synchronization with the switching signal CH.

In a pair of switching circuits including an odd-numbered switching circuit and an even-numbered switching circuit (e.g., switching circuits $A_1$ and $A_2$, $A_3$ and $A_4$, and $A_5$ and $A_6$), the connecting point of the switching elements Yb and Ya of the first network in the odd-numbered switching element is connected to the connecting point of the switching elements Xa and Xb of the first network in the even-numbered switching element as indicated by P1 in FIG. 1.

In a pair of switching circuits including an even-numbered switching circuit and odd-numbered switching circuits (e.g., switching circuits $A_2$ and $A_3$, $A_4$ and $A_5$, and $A_6$ and $A_7$), the connecting point of the switching elements Yb and Ya of the second network in the even-numbered switching element is connected to the connecting point of the switching elements Xa and Xb of the second network in the odd-numbered switching element as indicated by P2 in FIG. 1.

In operation, start data DS is applied either through a switching element S1 to the input terminal IN of the transfer element $B_1$ in the first stage, or through a switching element S2 to the input terminal IN of the transfer element $B_n$ in the last stage. The switching element S1 is rendered conductive (i.e., on) when the switching control signal CH is at the high level, and rendered non-conductive (i.e., off) when it is at the low level. In contrast, the switching element S2 is rendered non-conductive (i.e., off) when the switching control signal CH is at the high level and rendered conductive (i.e., on) when it is at the low level.

The transfer elements $B_1$ through $B_n$ may be composed of conventional components such as an analog switch combined with a flip-flop circuit, a CMOS inverter having a hysteresis characteristic, and a capacitive element.

Figure 2:
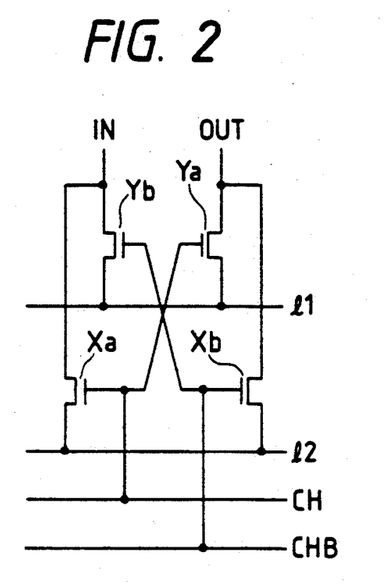
FIGS. 2 through 5 are circuit diagrams showing essential circuit elements for the shift register of FIG. 1.
Figure 3:
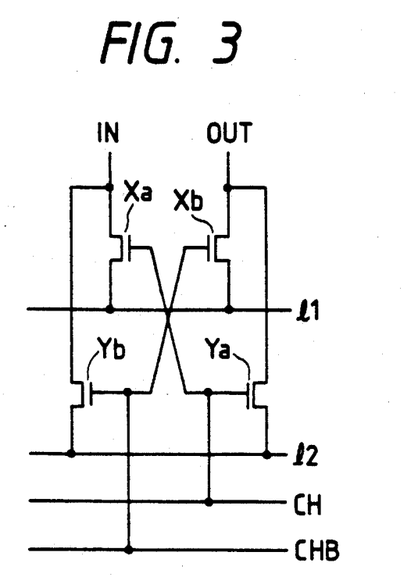
Figure 4:
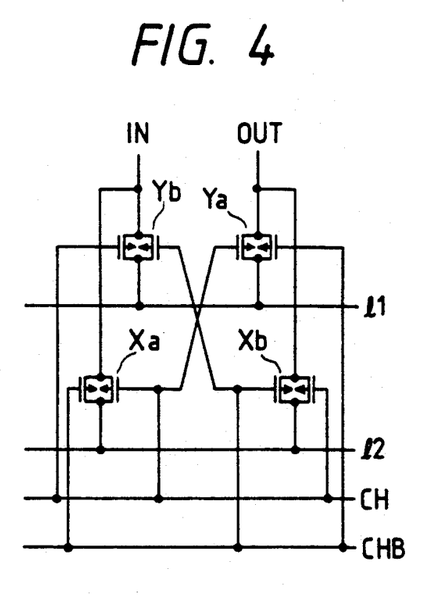
Figure 5:
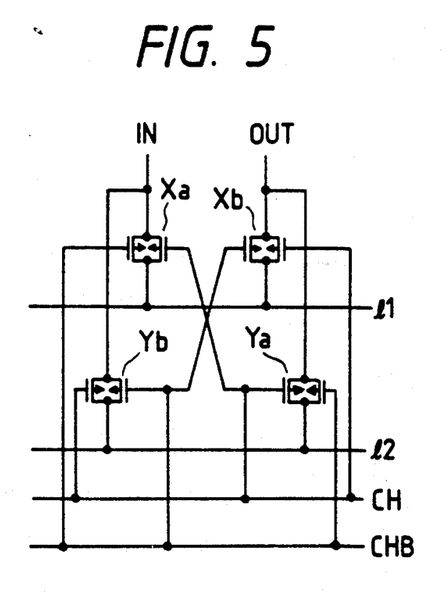

The switching elements may be composed of NMOS transistors (FIGS. 2 and 3) or CMOS analog switches, formed by combining P-channel MOS transistors, and N-channel MOS transistors (FIGS. 4 and 5). The switching circuits shown in FIGS. 2 and 4 correspond to the odd-numbered switching circuits $A_1$, $A_3$, $A_5$, and so on, and the switching circuits shown in FIGS. 3 and 5 correspond to the even-numbered switching circuits $A_2$, $A_4$, $A_6$, and so on.

In FIGS. 2 through 5, reference character 11 designates the wiring of the first network, and 12 designates the wiring of the second network.

Figure 6:
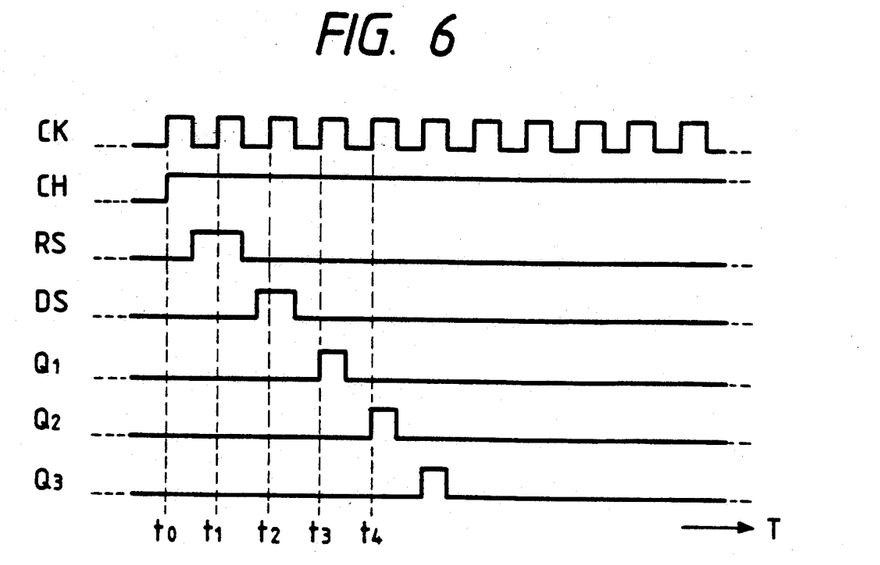
FIGS. 6 and 7 are timing charts for describing the operation of the shift register of FIG. 1.
Figure 7:
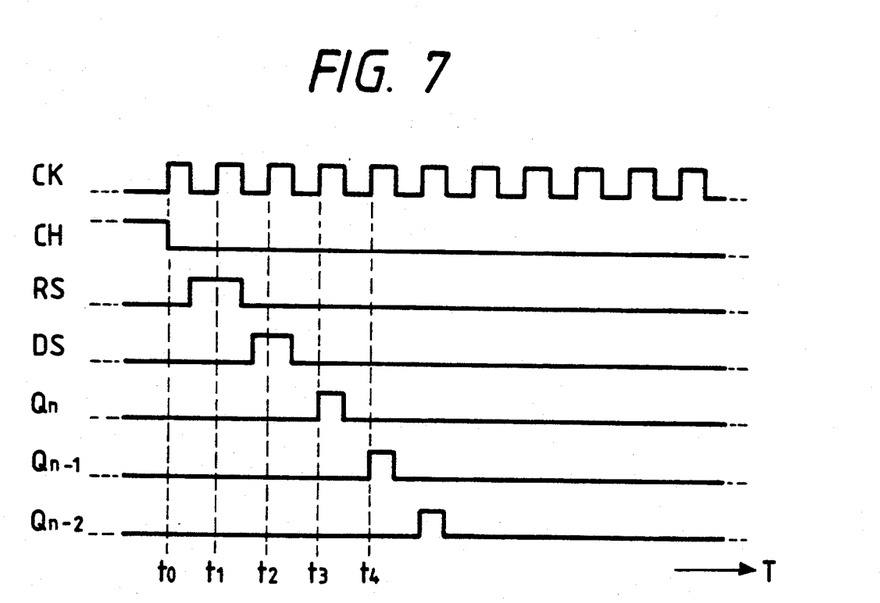

The operation of the shift register thus constructed will now be described with reference to the timing charts illustrated in FIGS. 6 and 7.

First, the operation will be described with reference to FIG. 6 in which the forward transfer is performed.

The clock signal CK, which is a rectangular signal having a predetermined frequency, is applied to the clock input terminals CLK, and at time $t_0$ the switching control signal CH is raised to the high level. In this case, the switching element S1 is rendered conductive (switching element S2 being rendered non-conductive) and the switching elements in the switching circuits $A_1$ through $A_n$ are operated as indicated in TABLE 1. When the reset signal RS is raised to the high level, all of the transfer elements B1 through Bn are initialized.

In this situation, the start data DS which is at the high level is applied to the shift register and held in the input of the first stage of the transfer element $B_1$ in synchronization with the clock signal CK. The data is then successively transferred to the transfer elements in the following stages in synchronization with the clock signal, which is inverted in level with a predetermined period.

When the switching control signal CH is raised to the high level, the switching elements Ya and Xa in each switching circuit are rendered conductive (i.e., on) and the switching elements Yb and Xb are rendered non-conductive (i.e., off). Hence, the output terminal OUT of the transfer element in one stage is electrically connected to the input terminal IN of the transfer element in the next stage. Thus, the input data is transferred to the right in FIG. 1 (i.e., the forward transfer direction).

Next, the operation of the shift register will be described with reference to FIG. 7 in which the reverse transfer is performed.

Similar to the forward transfer, the clock signal CK having a predetermining period is applied to the shift register, and the reset signal RS is raised to a high level, so that all the transfer elements $A_1$ through $A_n$ are initialized. In addition, the switching control signal CH is set to the low level, so that switching element S2 is rendered conductive (switching element S1 being rendered non-conductive) and the switching elements in the switching circuits $A_1$ through $A_n$ are operated as indicated in TABLE 1.

At time $t_2$, the start data DS, which is at a high level, is applied to the shift register. In synchronism with the clock signal CK, the start data DS is held in the transfer element $B_n$ in the last stage, and only the output $Q_n$ thereof is raised to the high level. The data is successively transferred to the transfer elements in the preceding stages in synchronization with the clock signal CK, which is inverted in level with the predetermined period.

When the switching control signal CH is set to the low level, the switching elements Ya and Xa are rendered nonconductive (i.e., off) and the switching elements Yb and Xb are rendered conductive (i.e., on). Hence, the output terminal OUT of the transfer element in one stage is electrically connected to the input terminal IN of the transfer element in the preceding stage. Thus, the input data is transferred to the left in FIG. 1 (i.e., the reverse transfer direction).

The shift register, in accordance with the present invention, can transfer input data in the forward direction or in the reverse direction. When necessary, the shift register can change the data transfer direction during operation, thus enabling the shift register to be applicable to a larger range of applications than a conventional shift register.

In the shift register described above, it should be noted that the technical concept of the invention is not limited to a shift register with a serial preset (i.e., serial mode) of start data. The shift register can also be preset in a parallel with a plurality of data bits.

An example of a solid-state image pickup device (a so-called "MOS type" solid-state image pickup device) will be described with reference to FIG. 8, which employs the shift register as hereinbefore disclosed.

The solid-state image pickup device has a light receiving region which includes a plurality of photodiodes $D_{11}$ through $D_{mn}$ arranged in matrix form, horizontal scanning lines $Y_1$ through $Y_n$ that respectively extend from switching elements $OM_1$ through $OM_n$, and vertical scanning lines $X_1$ through $X_m$ that respectively extend from output terminals $Q_1$ through $Q_m$ of a vertical shift register 2. The switching elements $OM_1$ through $OM_n$ are switched on and off in response to the gate signals which are respectively provided via the output terminals $Q_1$ through $Q_n$ of the horizontal shift register 1. The remaining terminals of the switching elements $OM_1$ through $OM_n$ are connected to a common signal output line OL.

The switching elements $M_{11}$ through $M_{mn}$ are rendered conductive (i.e., on) by vertical scanning signals, which are respectively applied to the vertical scanning lines, so that the picture element signals of the photodiodes $D_{11}$ through $D_{mn}$ are applied to the respective horizontal scanning lines in a time series mode to the signal output line OL through the switching elements $OM_1$ through $OM_n$.

Figure 8:
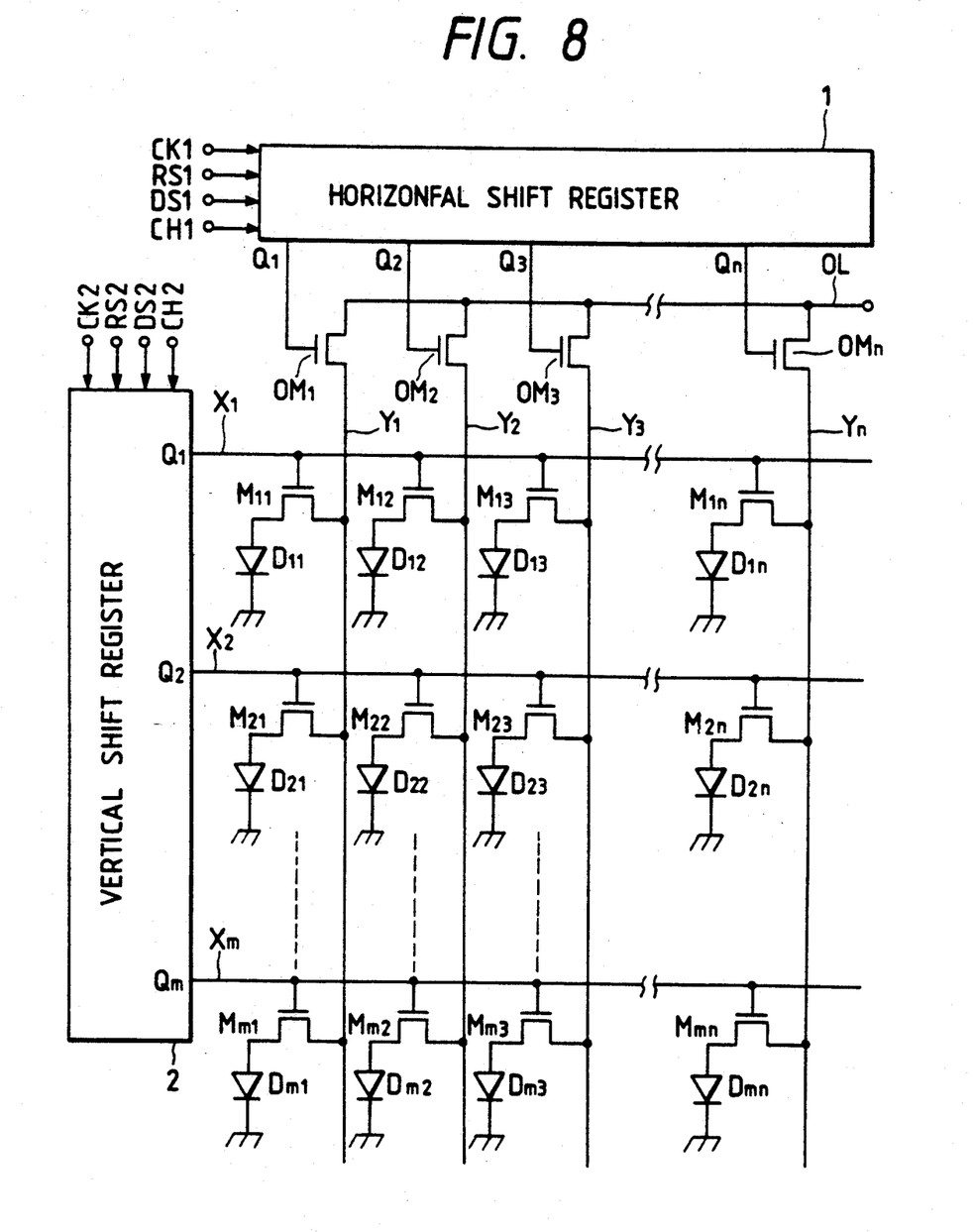
FIG. 8 is an explanatory diagram showing an arrangement of one example of a solid-state image pickup device employing the shift register according to the present invention.

In the image pickup device shown in FIG. 8, the horizontal shift register 1 and the vertical shift register 2 are identical to that which is shown in FIG. 1. The output signals of the shift registers 1 and 2 are employed for horizontal scanning and vertical scanning which are provided through the output terminals OUT of the transfer elements in the shift registers.

A clock signal CK1, a reset signal RS1, start data DS1, and a switching control signal CH1 which are applied to the horizontal shift register 1 respectively correspond to the clock signal CK, the reset signal RS, the start data DS, and the switching control signal CH applied to the shift register shown in FIG. 1. Similarly, a clock signal CK2, a reset signal RS2, start data DS2, and a switching control signal CH2, which are applied to the vertical shift register 2, respectively correspond to the clock signal CK, the reset signal RS, the start data DS, and the switching control signal CH applied to the shift register shown in FIG. 1.

In the solid-state image pickup device thus described, the forward transfer of picture element signals is performed by horizontal scan reading and vertical scan reading. That is, picture element signals can be read out as in the prior art. However, by switching the forward transfer mode over to the reverse transfer mode, the order of reading picture element signals can be changed, so that picture element signals corresponding to the mirror image can be easily obtained.

Figure 9:
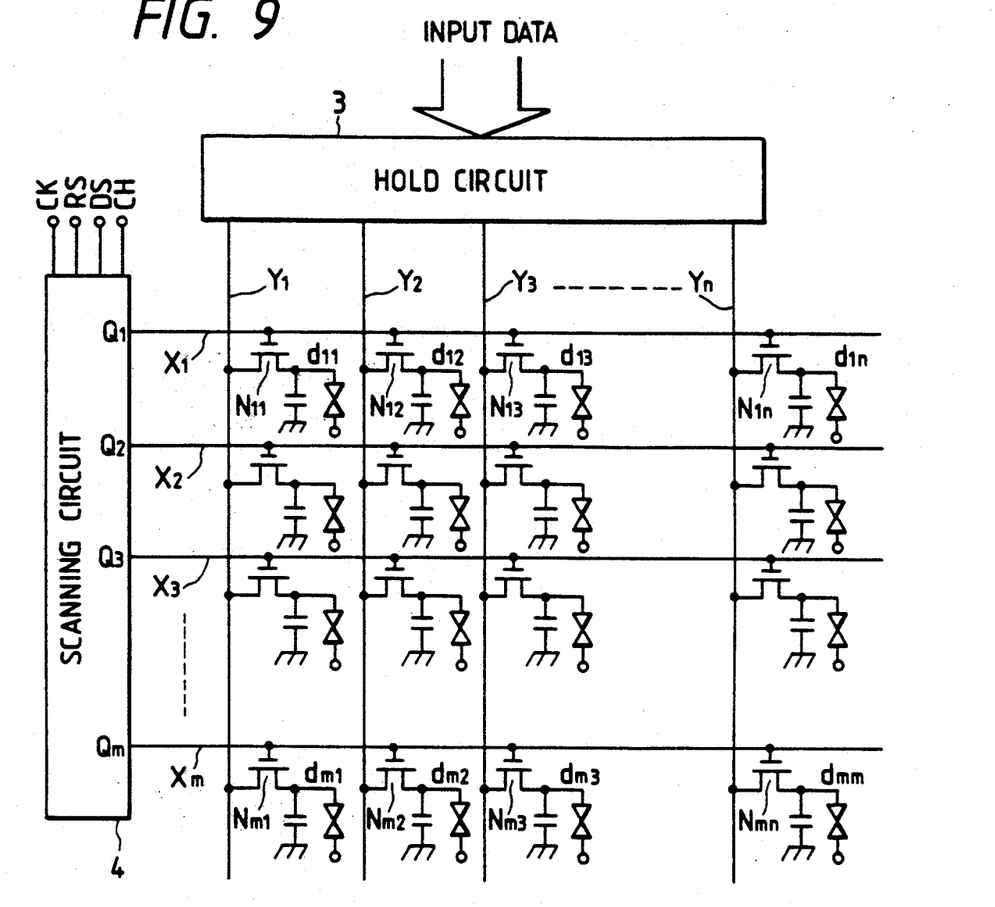
FIG. 9 is an explanatory diagram showing an arrangement of one example of a liquid crystal display unit employing the shift register according to the invention.

An example of a liquid crystal display unit employing the shift register according to the invention will now be described with reference to FIG. 9.

The liquid crystal display unit includes a hold circuit 3 for holding input picture element data corresponding to that which is obtained for a horizontal scan period, a scanning circuit 4, and liquid crystal display elements $d_{11}$ through $d_{mn}$ provided at the intersections of signal output lines $Y_1$ through $Y_n$ and scanning signal lines $X_1$ through $X_m$. The scanning circuit 4 supplies scanning signals at predetermined intervals to switching elements $N_{11}$ through $N_{mn}$ that are respectively connected to the liquid crystal display elements $d_{11}$ through $d_{mn}$ to operate the switching elements, so that images are displayed in correspondence to picture element signals provided by the hold circuit 3.

The shift register shown in FIG. 1 is employed as the scanning circuit 4. Therefore, in the scanning circuit 4, the direction of transfer of the start data DS can be changed by inverting the switching control signal CH. That is, the order of scanning the image can be changed so that the normal image or the mirror image can be obtained with ease.

As the forgoing describes, by selectively operating the first switching circuits and the second switching circuits, the direction of transfer of data can be changed. That is, the data can be transferred in the forward direction or in the reverse direction. The shift register, having a wide range of application, is particularly suited for video equipment.

In the case where the shift register of the invention is applied to at least one of the horizontal and vertical scanning registers of a solid-state image pickup device, the order of reading data by scanning can be selectively changed, so that the picture element signals can be outputted which can reproduce not only the normal image but also the mirror image of the object. Hence, according to the invention, a solid-state image pickup device for forming the mirror image of an object can be provided in the field of graphic design.

Similarly, in the case where the shift register of the invention is applied to a liquid crystal display unit, the order of reading data by scanning can be selectively changed, so that the normal image or the mirror image of the object can be displayed. Hence, a liquid crystal display unit which can display the mirror image of an object can be proposed in the field of graphic design according to the invention.

What is claimed is:

1. A bi-directional shift register having a plurality of stages for transferring bit data from one stage to an adjacent stage in synchronism with a clock signal, comprising: a plurality of cascade-connected transfer elements, one of said transfer elements being in each said stage of said shift register, each of said plurality of transfer elements having an input terminal, output terminal, and a clock input terminal, said clock signal being applied to said clock input terminal of each of said transfer elements for causing said transfer elements to synchronously transfer data in each said stage applied to said input terminal to said output terminal; a first switching circuit including a first pair of switches, both responsive to a first control signal for electrically connecting the output terminal of one transfer element directly to a following input terminal of an immediately following transfer element for causing said bit data to be transferred in a forward direction; and a second switching circuit including a second pair of switches, both responsive to said first control signal inverted for electrically connecting the output terminal of one transfer element directly to a preceding input terminal of an immediately preceding transfer element for causing said bit data to be transferred in a reverse direction.

2. A solid-state image pickup device comprising: a plurality of photo-electric conversion elements corresponding to picture elements arranged in a matrix form; a horizontal shift register for horizontally scanning said plurality of photo-electric conversion elements; and a vertical shift register for vertically scanning said plurality of photo-electric conversion elements, wherein at least one of said horizontal and vertical shift registers includes a bi-directional shift register, said bidirectional shift register having a plurality of stages for transferring bit data from one stage to an adjacent stage in synchronism with a clock signal, said bi-directional shift register comprising: a plurality of cascade-connected transfer elements, one of said transfer elements being in each said stage of said shift register, each of said plurality of transfer elements having an input terminal, output terminal, and a clock input terminal, said clock signal being applied to said clock input terminal of each of said transfer elements for causing said transfer elements to synchronously transfer data in each said stage applied to said input terminal to said output terminal; a first switching circuit including a first pair of switches, both responsive to a first control signal for electrically connecting the output terminal of one transfer element directly to a following input terminal of an immediately following transfer element for causing said bit data to be transferred in a forward direction; and a second switching circuit including a second pair of switches, both responsive to said first control signal inverted for electrically connecting the output terminal of one transfer element directly to a preceding input terminal of an immediately preceding transfer element for causing said bit data to be transferred in a reverse direction.

3. A liquid crystal display unit comprising: a plurality of liquid crystal display elements corresponding to picture elements arranged in a matrix form; and a scanning register for scanning said liquid crystal display elements for controlling optical transmission of said liquid crystal display elements to a display, wherein said scanning register includes a bi-directional shift register, said bi-directional shift register having a plurality of stages for transferring bit data from one stage to an adjacent stage in synchronism with a clock signal, said bi-directional shift register comprising: a plurality of cascade-connected transfer elements, one of said transfer elements being in each said stage of said shift register, each of said plurality of transfer elements having an input terminal, output terminal, and a clock input terminal, said clock signal being applied to said clock input terminal of each of said transfer elements for causing said transfer element to synchronously transfer data in each said stage applied to said input terminal to said output terminal; a first switching circuit including a pair of switches, both responsive to a first control signal for electrically connecting the output terminal of one transfer element directly to a following input terminal of an immediately following transfer element for causing said bit data to be transferred in a forward direction; and a second switching circuit including a pair of switches, both responsive to said first control signal inverted for electrically connecting the output terminal of one transfer element directly to a preceding input terminal of an immediately preceding transfer element for causing said bit data to be transferred in a reverse direction.

4. The shift register as claimed in claim 1, further comprising: a first switch means responsive to said first control signal for electrically connecting the input terminal of a transfer element in a first stage to a first input of said shift register; and a second switch means responsive to said inverted first control signal for electrically connecting the input of a transfer element in a last stage to a second input of said shift register.

5. The shift register as claimed in claim 1, wherein said shift register has a means for inputting said bit data in a serial mode and in parallel mode.

6. The shift register as claimed in claim 1, wherein said first and second pairs of switches are NMOS transistors.

7. The shift register as claimed in claim 1, wherein said first and second pairs of switches are CMOS analog switches formed by combining P-channel MOS transistors and N-channel MOS transistors.

* * * * *